United States Patent [19]
Rolfson et al.

[11] Patent Number: 6,066,507
[45] Date of Patent: *May 23, 2000

[54] METHOD TO FORM AN INSULATIVE BARRIER USEFUL IN FIELD EMISSION DISPLAYS FOR REDUCING SURFACE LEAKAGE

[75] Inventors: J. Brett Rolfson; Kevin Tjaden; Trung T. Doan; Tyler A. Lowery; David A. Cathey, all of Boise, Id.

[73] Assignee: Micron Technology, Inc., Boise, Id.

[*] Notice: This patent is subject to a terminal disclaimer.

[21] Appl. No.: 08/949,931

[22] Filed: Oct. 14, 1997

Related U.S. Application Data

[63] Continuation of application No. 08/300,616, Sep. 2, 1994, Pat. No. 5,696,028, which is a continuation-in-part of application No. 08/053,794, Apr. 27, 1993, Pat. No. 5,372,973, which is a continuation of application No. 07/837,453, Feb. 14, 1992, Pat. No. 5,229,331.

[51] Int. Cl.[7] .................................................. H01L 21/00
[52] U.S. Cl. .................................. 438/20; 445/24; 445/50
[58] Field of Search ................................. 438/20; 445/24, 445/50

[56] References Cited

U.S. PATENT DOCUMENTS

| | | | |
|---|---|---|---|
| 3,665,241 | 5/1972 | Spindt et al. | 313/351 |
| 3,721,022 | 3/1973 | Mercorelli | 35/77 |
| 3,755,704 | 8/1973 | Spindt et al. | 313/309 |
| 3,789,471 | 2/1974 | Spindt et al. | 29/25.17 |
| 3,812,559 | 5/1974 | Spindt et al. | 29/25.18 |
| 3,875,442 | 4/1975 | Wasa et al. | 313/193 |
| 3,921,022 | 11/1975 | Levine | 313/309 |
| 3,970,887 | 7/1976 | Smith et al. | 313/309 |
| 3,998,678 | 12/1976 | Fukase et al. | 156/3 |
| 4,666,553 | 5/1987 | Blumenfeld et al. | 156/643 |
| 4,671,851 | 6/1987 | Beyer et al. | 156/645 |
| 4,746,629 | 5/1988 | Hanagasaki | 437/162 |
| 4,763,187 | 8/1988 | Biberian | 358/56 |
| 4,766,340 | 8/1988 | van der Mast et al. | 313/366 |

(List continued on next page.)

FOREIGN PATENT DOCUMENTS

| | | |
|---|---|---|
| 0 520 780 A1 | 12/1992 | European Pat. Off. . |
| 49-122269 | 11/1974 | Japan . |
| 51-21471 | 2/1976 | Japan . |
| 51-120167 | 10/1976 | Japan . |
| 52-119164 | 10/1977 | Japan . |
| 52-132771 | 11/1977 | Japan . |
| 56-160740 | 12/1981 | Japan . |
| 61-120424 | 6/1986 | Japan . |
| 1-128332 | 5/1989 | Japan . |
| 3-22329 | 1/1991 | Japan . |
| 3-194829 | 8/1991 | Japan . |
| 5-21002 | 1/1993 | Japan . |
| 5-21003 | 1/1993 | Japan . |

OTHER PUBLICATIONS

M. Sokolich et al., "Field Emission From Submicron Emitter Arrays," IEEE, International Electron Devices Meeting, San Francisco, CA., Dec. 9–12, 1990, pp. 159–162.

Liut et al., "Fabrication of self–aligned gated field emitters," Dept. of Electrical Eng., New Jersey Inst. of Technology, Jan. 1992, pp. 21–24.

"Extended Abstracts," The Japan Society of Applied Physics, (The 53$^{rd}$ Autumn Meeting, 1992), p. 553.

Stanley Wolf Ph.D., "Silicon Processing For The VLSI Era," vol. 2: Process Integration, p. 239., 1990.

*Primary Examiner*—Richard Booth
*Attorney, Agent, or Firm*—Fletcher, Yoder & Van Someren

[57] ABSTRACT

A field emitter display having reduced surface leakage comprising at least one emitter tip surrounded by a dielectric region. The dielectric region is formed of a composite of insulative layers, at least one of which has fins extending toward the emitter tip. A conductive gate, for extracting electrons from the emitter tip, is disposed superjacent the dielectric region. The fins increase the length of the path that leaked electrical charge travels before impacting the gate.

28 Claims, 3 Drawing Sheets

U.S. PATENT DOCUMENTS

| | | | |
|---|---|---|---|
| 4,857,161 | 8/1989 | Borel et al. | 204/192.26 |
| 4,857,799 | 8/1989 | Spindt et al. | 313/495 |
| 4,943,343 | 7/1990 | Bardai et al. | 156/643 |
| 4,964,946 | 10/1990 | Gray et al. | 156/643 |
| 5,036,015 | 7/1991 | Sandhu et al. | 437/8 |
| 5,038,070 | 8/1991 | Bardai et al. | 313/309 |
| 5,055,158 | 10/1991 | Gallagher et al. | 156/643 |
| 5,057,047 | 10/1991 | Greene et al. | 445/24 |
| 5,070,282 | 12/1991 | Epsztein | 315/383 |
| 5,075,591 | 12/1991 | Holmberg | 313/495 |
| 5,143,820 | 9/1992 | Kotecha et al. | 430/314 |
| 5,151,061 | 9/1992 | Sandhu et al. | 445/24 |
| 5,186,670 | 2/1993 | Doan et al. | 445/24 |
| 5,188,977 | 2/1993 | Stengl et al. | 437/89 |
| 5,209,687 | 5/1993 | Konishi . | |
| 5,229,331 | 7/1993 | Doan et al. | 437/228 |
| 5,232,549 | 8/1993 | Cathey et al. | 456/633 |
| 5,259,799 | 11/1993 | Doan et al. | 445/24 |
| 5,266,530 | 11/1993 | Bagley et al. . | |
| 5,302,238 | 4/1994 | Roe et al. | 156/643 |
| 5,372,973 | 12/1994 | Doan et al. | 437/228 |
| 5,378,182 | 1/1995 | Liu | 445/24 |
| 5,394,006 | 2/1995 | Liu | 257/506 |

METHOD TO FORM AN INSULATIVE BARRIER USEFUL IN FIELD EMISSION DISPLAYS FOR REDUCING SURFACE LEAKAGE

CROSS-REFERENCE TO RELATED APPLICATION

This is a continuation of U.S. patent application Ser. No. 08/300,616 filed on Sep. 2, 1994 now U.S. Pat. No. 5,696,028; which is a continuation in part application to U.S. Pat. No. 5,372,973, filed as U.S. patent application Ser. No. 08/053,794, on Apr. 27, 1993, which is a continuation application of U.S. Pat. No. 5,229,331, filed as U.S. patent application Ser. No. 07/837,453, on Feb. 14, 1992.

FIELD OF THE INVENTION

This invention relates to field emission devices, and more particularly to processes for manufacturing field emission structures which have reduced surface leakage between the gate structure and the emitter tip.

BACKGROUND OF THE INVENTION

Cathode ray tube (CRT) displays, such as those commonly used in desk-top computer screens, function as a result of a scanning electron beam from an electron gun, impinging on phosphors on a relatively distant screen. The electrons increase the energy level of the phosphors. When the phosphors return to their normal energy level, they release the energy from the electrons as a photon of light, which is transmitted through the glass screen of the display to the viewer. One disadvantage of a CRT is the depth of the display required to accommodate the raster scanner.

Flat panel displays have become increasingly important in appliances requiring lightweight portable screens. Currently, such screens use electroluminescent or liquid crystal technology. Another promising technology is the use of a matrix-addressable array of cold cathode emission devices to excite phosphor on a screen, often referred to as a field emitter display.

Spindt, et. al. discuss field emission cathode structures in U.S. Pat. Nos. 3,665,241, and 3,755,704, and 3,812,559. To produce the desired field emission, a potential source is provided with its positive terminal connected to the gate, or grid, and its negative terminal connected to the emitter electrode (cathode conductor substrate). The potential source is variable for the purpose of controlling the electron emission current.

Upon application of a potential between the electrodes, an electric field is established between the emitter tips and the low potential anode grid, thus causing electrons to be emitted from the cathode tips through the holes in the grid electrode.

The clarity, or resolution, of a field emission display is a function of a number of factors, including emitter tip sharpness, alignment and spacing of the gates, or grid openings, which surround the tips, pixel size, as well as cathode-to-gate and cathode-to-screen voltages. These factors are also interrelated. For example, the voltage required for electron emission from the emitter tips is a function of both cathode-to-gate spacing and tip sharpness.

SUMMARY OF THE INVENTION

The present invention employs a self-aligned process for fabricating field emission displays. The disclosed process utilizes multiple, selectively etchable dielectric layers in combination with chemical mechanical planarization to create an insulative barrier for reducing surface leakage on the field emission structures (i.e. the tips and the gate).

The addition of the insulative layer of the present invention between a field emission tip and the associated extraction grid lengthens the surface path, thereby reducing the likelihood of surface leakage.

A method is provided for fabricating a field emitter display having improved emission. The method comprises creating a dielectric region around an emitter tip, and disposing a gate superjacent the dielectric region. The dielectric region has fins extending therefrom which increase the surface path from the base of the tip to the gate.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
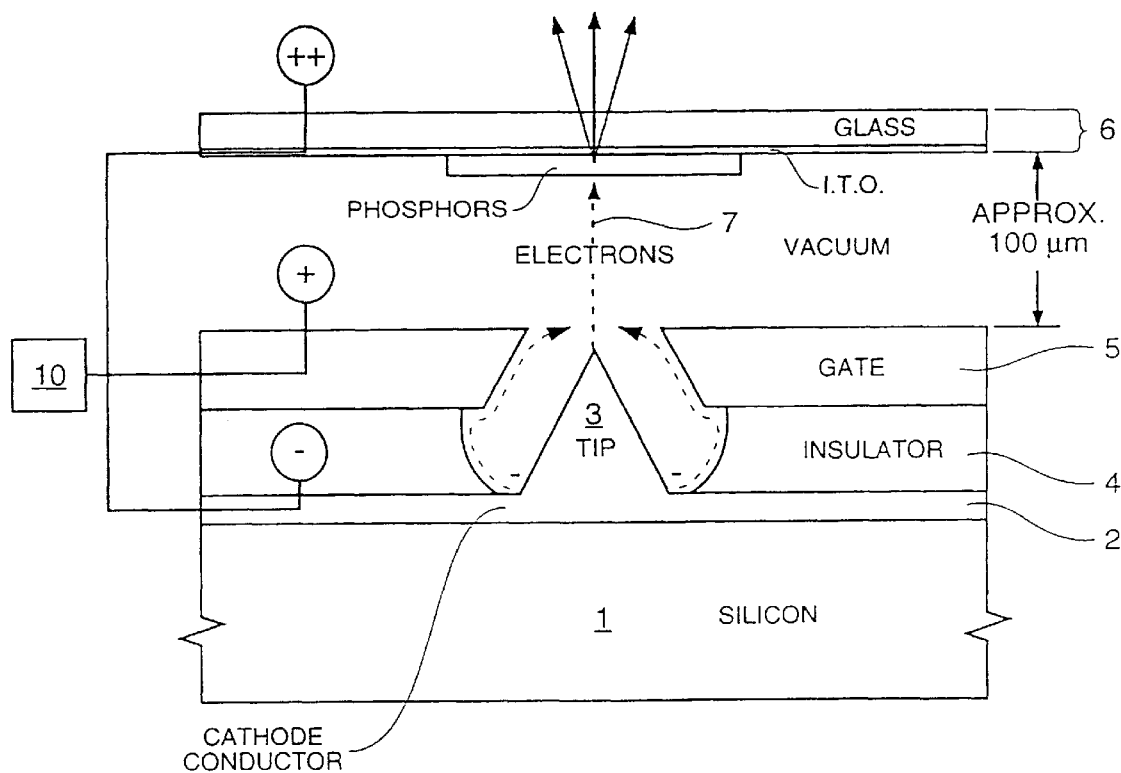
FIG. 1 is a cross-sectional schematic drawing of a conventional field emission display.

Referring to FIG. 1, a conventional field emission display employing a cold cathode is depicted. The substrate 1 is typically comprised of a suitable semiconductor material.

At a field emission site location, a conical micro-cathode 3 has been constructed on top of the substrate 1. Surrounding the micro-cathode 3, is a low potential anode gate structure 5. When a voltage differential, through source 10, is applied between the cathode 3 and the gate 5, a stream of electrons 7 is emitted toward a phosphor coated screen 6. Screen 6 functions as an anode.

The electron emission tip 3 serves as a cathode conductor. Gate 5 serves as a low potential anode or grid structure for its respective cathode 3. A dielectric insulating layer 4 is located on the conductive cathode layer 2. The insulator 4 also has an opening at the field emission site location.

The dotted lines, in FIG. 1, illustrate the paths followed by electrons that have leaked from the cathode tip 3. The tip 3 has a negative charge relative to the gate 5. Although the electron stream 7 emanates from the apex of the tip 3, some of the electrons 7 leak from the base of the tip 3 to the gate 5 largely travelling along the insulative surface 4 between them. The surface leakage from cathode 3 to gate 5 is a parasitic power loss, as well as a potential source for generating a destructive arc.

The present invention is best understood with reference to FIGS. 2–5 of the drawings which depict the initial, intermediate and final structures produced by a series of manufacturing steps according to the present invention.

There are several methods by which to form the electron emission tips 13 employed in the process of the present invention. An example of such a method is proposed in U.S. Pat. No. 3,970,887 entitled, "Micro-structure Field Emission Electron Source." The preferred method is disclosed in U.S. Pat. No. 5,302,238 entitled, "Plasma Dry Etch to Produce Atomically Sharp Asperities Useful as Cold Cathodes," and U.S. application Ser. No. 08/184,819 entitled, "A Method of Forming a Substantially Uniform Array of Sharp Tips," both of which have also been assigned to Micron Technology.

One method of tip formation (not shown) is accomplished by providing a semiconductor substrate 11 of either P or N-type which is selectively masked at the future field emission cathode sites.

Thereafter, selective sidewise removal of the underlying peripheral surrounding regions of the semiconductor substrate 11 beneath the edges of the masked island areas results in the production of a centrally disposed, raised, field emitter tip 13 in the region immediately under each masked island area defining a field emission cathode site.

In one embodiment of the present invention, the tip of the electron emitter 13 is sharpened through an oxidation process before beginning the gate 15 formation process. The surface of the silicon wafer (Si), or other substrate, 11 and the emitter tip 13 are oxidized to produce an oxide layer of $SiO_2$, which is then etched to sharpen the tip 13. Any conventional, known oxidation process may be employed in forming the $SiO_2$, and etching the tip 13.

In an alternative embodiment of the process of the present invention, the tip of the electron emitter 13 is sharpened through an oxidation process during gate 15 formation. As will be discussed below, the process of the present invention employs an oxide layer 14a proximate to the tip 13 which electrically and physically separates the tips 13 from the gate 15.

After the formation of the emitter tip 13, a composite insulative (dielectric) layer 14 is formed. Composite, combination, or compound referring to the group of separate multiple layers 14a–14c . . . 14n which comprise layer 14. Layer 14 has a thickness in the range of 100 Å to 4000 Å.

Although a composite of three layers is illustrated, layer 14 can be comprised of more layers. The types and thicknesses of the materials selected for the insulating dielectric layer 14 determine the gate 15 to cathode 13 spacing. Hence, depending on the desired gate to cathode spacing, the number and thickness of the insulative dielectric layers 14a . . . 14n is adjusted.

The thickness of the insulating layers 14a and 14c, together with the selectively etchable insulating layer 14b also determines the gate 15 to substrate 11 spacing.

Figure 2:
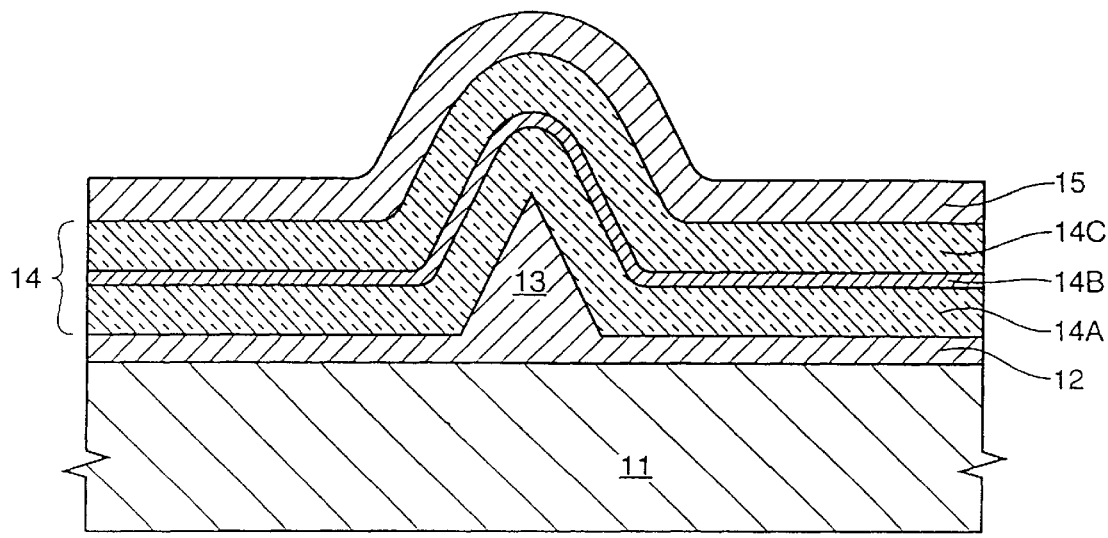
FIG. 2 is a cross-sectional schematic drawing of an electron emitter tip having multiple conformal insulating layers and a conductive gate layer deposited thereon, according to the process of the present invention.

The composite insulative layer 14 comprises selectively etchable material layers 14a–14c. FIG. 2 illustrates one embodiment of the present invention in which the insulative layer 14 is comprised of oxide/nitride/oxide.

The composite insulating layer 14, as shown in FIG. 2, is a conformal insulating layer 14. The insulative layers 14 are deposited on the emitter tip 13 in a manner such that the layers 14 conform to the conical shape of the cathode emitter tip 13.

In the illustrative embodiment, a layer of oxide 14a is deposited superjacent the emitter tip 13. The oxide layer 14a is conformal in nature, and therefore uniformly blankets the tip 13 and the substrate surface 11. The illustrative embodiment uses silicon dioxide, tetraethylorthosilicate (TEOS), or other suitable oxide.

Alternatively, the oxide layer is grown superjacent the tip 13 to a desired thickness. Growing the oxide layer 14a, likewise yields a conformal layer 14a. This is the method by which the emitter tip 13 is simultaneously sharpened. As the oxide 14a is grown, silicon is consumed from the sides of the tips 13. When the oxide layer 14a is subsequently removed, the tip 13 becomes thinner, and consequently, sharper as a result.

The next layer in the illustrative embodiment is a conformally deposited nitride layer 14b, such as silicon nitride. A nitride 14b is selected because nitrides are selectively etchable with respect to oxides, which comprise the other insulative layers 14a and 14c, in the illustrative embodiment.

Although other materials which are selectively etchable with respect to the insulative layers 14a and 14c may be used, (e.g., silicon oxynitride) a silicon nitride layer 14b is particularly effective against oxygen diffusion. Therefore, a nitride is useful for layers as thin as 1000 Å. However, the insulative layer 14b is preferably greater than 1000 Å. Silicon nitride is also preferred because it is easier to stop a CMP process on a nitride layer than on an oxide layer. Additionally, nitrides have a higher mechanical strength than oxides.

The silicon nitride layer 14b is preferably deposited by Chemical Vapor Deposition (CVD) methods, including, but not limited to Low Pressure Chemical Vapor Deposition (LPCVD) and Plasma Enhanced Chemical Vapor Deposition (PECVD). It is also possible to deposit the nitride layer 14b using dichlorosilane ($SiCl_2H_2$) and ammonia ($NH_3$).

Dielectric layer 14c is disposed superjacent nitride layer 14b. The illustrative embodiment uses silicon dioxide, tetraethylorthosilicate (TEOS), or other suitable oxide. The insulative layer 14c is also deposited by a technique, such as Chemical Vapor Deposition (CVD).

The next step in the process is the deposition of the conductive gate material 15. The gate 15 is formed from a conductive layer. The conductive material layer may comprise a metal such as chromium or molybdenum, but the preferred material for this process is deemed to be doped polysilicon. The conductive material 15 is also preferably conformal in nature.

In one embodiment of the present invention, a buffer material is deposited to prevent the undesired etching of the lower-lying portions of the conductive gate material layer during the chemical mechanical polishing (CMP) step which follows.

A suitable buffering material is a thin layer of $Si_3N_4$. The nitride buffer layer has the effect of protecting the tip 13, which is one advantage of performing this optional step. The buffering layer substantially impedes the progress of the CMP into the layer on which the buffering material is deposited.

Figure 3:
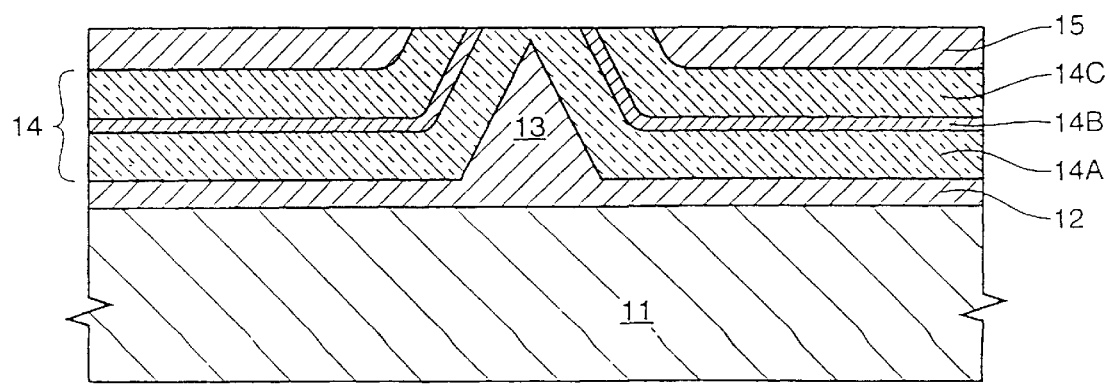
FIG. 3 is a cross-sectional schematic drawing of the electron emitting tip of FIG. 2, after a chemical mechanical planarization (CMP) step has been performed, according to the process of the present invention.

The next step in the gate formation process is the chemical mechanical planarization (CMP), also referred to in the art as chemical mechanical polishing (CMP). Through the use of chemical and abrasive techniques, the buffer material as well as any other layers (e.g. the conductive material layer 15 and the conformal insulating layers 14a–14c) extending beyond the emitter tip 13 are "polished" away. This is the manner by which the gate 15 and emitter tips 13 of the present invention are self-aligned, as illustrated in FIG. 3.

In contrast, the gate etch masks of early field emission displays were manually aligned to emitter tips. Manual alignment introduces variability into the process, which often results in less than optimum electron emission patterns. The self-aligned fabrication of emitter tips 13 and gates 15 greatly reduces process variability, decreases manufacturing costs, and results in a display having greater image sharpness.

In general, CMP involves holding or rotating a wafer of semiconductor material against a wetted polishing surface under controlled chemical slurry, pressure, and temperature conditions.

A chemical slurry containing a polishing agent such as alumina or silica may be utilized as the abrasive medium. Additionally, the chemical slurry may contain chemical etchants. This procedure is used to produce a surface with a desired endpoint or thickness, which also has a polished and planarized surface, as shown in FIG. 3.

Such apparatus for polishing are disclosed in U.S. Pat. Nos. 4,193,226 and 4,811,522. Another such apparatus is manufactured by Westech Engineering and is designated as a Model 372 Polisher.

CMP is performed substantially over the entire wafer surface, and at a high pressure. Initially, CMP will proceed at a very fast rate, as the peaks are being removed, then the rate will slow dramatically as the surface becomes more planar. The removal rate of the CMP is proportionally related to the pressure and the hardness of the surface being planarized.

FIG. 3 illustrates the intermediate step in the gate formation process following the chemical mechanical planarization CMP. A substantially planar surface is achieved, and the conformal insulating layers 14 are thereby exposed. FIG. 3 shows the means by which the conformal insulating layers 14 define the gate 15 to cathode 13 spacing, as well as the means by which the gate 15 is self-aligned.

Figure 4:
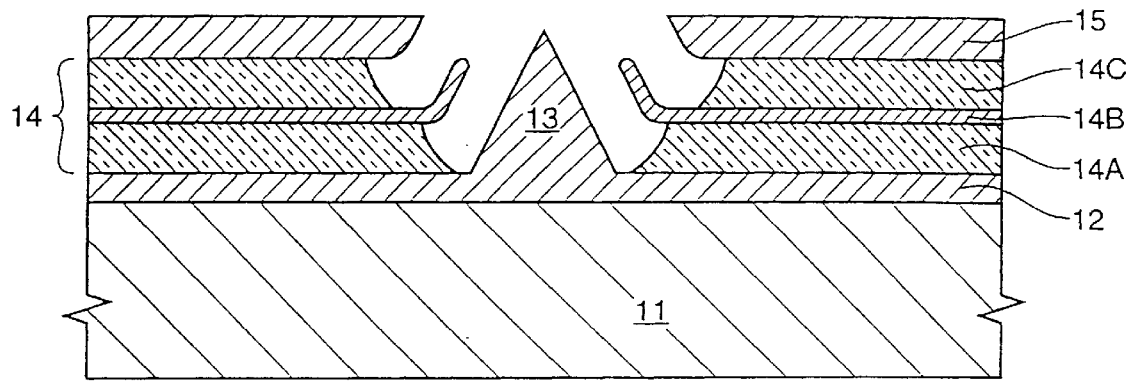
FIG. 4 is a cross-sectional schematic drawing of the electron emitting tip of FIG. 3, after the insulating layers have undergone an etching process to expose the emitter tip, according to the process of the present invention.

The next process step is a wet etching of the selectively-etchable material layers 14a–14c to expose the emitter tip 13. The insulating layer 14b is selectively is etchable with respect to the oxide insulating layers 14a and 14c. FIG. 4 illustrates the field emitter device after the insulating cavity has been so etched.

The layered emitter tip is dipped in hot phosphoric acid to etch back the nitride layer 14b to a point at which the fins do not interfere with the emissions of the tip 13.

A wet buffered oxide etch having sufficient selectivity to nitride is preferably used to remove the desired portions of insulating layers 14a and 14c. Hydrofluoric acid (HF) is an example of an etchant which has a sufficient selectivity to nitride. These are the preferred etchants due to their cost and commercial availability.

Alternatively, the oxide layers 14a and 14c are isotropically etched in a plasma environment using suitable etchant gases commonly known in the art.

Once the oxide layers 14a and 14c have been etched back, nitride fins 14b become apparent. These fins in nitride layer 14b increase the surface distance of the leakage path, as indicated by the dotted lines in FIG. 5. If multiple nitride layers 14b are formed, a series of fins results.

Figure 5:
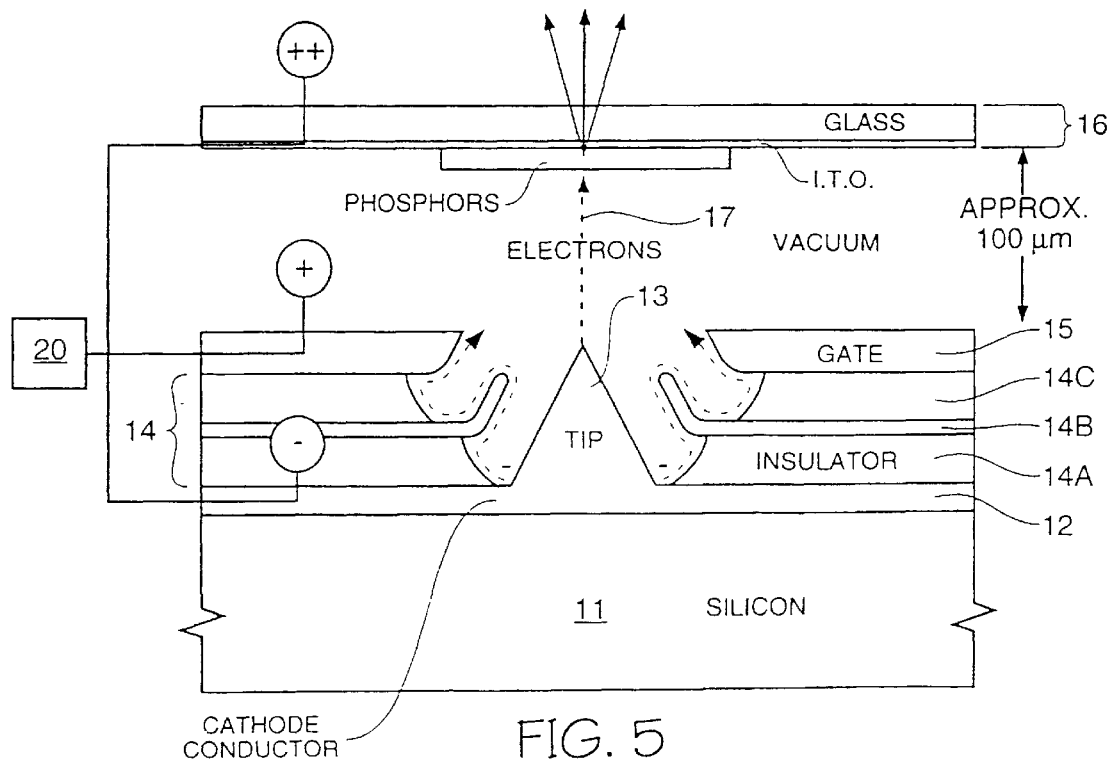
FIG. 5 is a cross-sectional schematic drawing of a field emission display of the present invention.

FIG. 5 illustrates the field emission display of the present invention. The substrate 11 is comprised of glass, for example, or any of a variety of other suitable materials. In the preferred embodiment, a single crystal silicon layer serves as a substrate 11 onto which a conductive material layer 12, such as doped polycrystalline silicon is deposited.

The electron emission tip 13 is integral with the single crystal semiconductor substrate 11, and serves as a cathode conductor. Gate 15 serves as a low potential anode or grid structure for its respective cathode 13. A dielectric insulating layer 14 is deposited on the conductive cathode layer 12. The insulator 14 also has an opening at the field emission site location.

If desired, the cathode tip 13 may, optionally, be coated with a low work-function material. Low work function materials include, but are not limited to cermet ($Cr_3Si+SiO_2$), cesium, rubidium, tantalum nitride, barium, chromium silicide, titanium carbide, molybdenum, and niobium.

Coating of the emitter tips may be accomplished in one of many ways. The low work-function material or its precursor may be deposited through sputtering or other suitable means on the tips 13. Certain metals (e.g., titanium or chromium) may be reacted with the silicon of the tips to form silicide during a rapid thermal processing (RTP) step. Following the RTP step, any unreacted metal is removed from the tip 13. In a nitrogen ambient, deposited tantalum may be converted during RTP to tantalum nitride, a material having a particularly low work function. The coating process variations are almost endless.

This results in an emitter tip 13 that may not only be sharper than a plain silicon tip, but that also has greater resistance to erosion and a lower work function. The silicide is formed by the reaction of the refractory metal with the underlying polysilicon by an anneal step.

In an alternative embodiment of the present invention (not shown), a flowable insulating layer is interposed among the conformal insulating layers 14a–14c, in the formation of composite layer 14. The flowable layer must still be selectively etchable with respect to the other insulating layers of the composite 14.

In this embodiment, a conformally deposited silicon nitride layer is formed first, and alone substantially determines the gate to cathode spacing. Although other materials which are selectively etchable with respect to the flowable insulative layer may be used, (e.g., $SiO_2$, and silicon oxynitride) a nitride layer is particularly effective against oxygen diffusion and, therefore, is useful for layers as thin as 1000 Å, but preferably greater than 1000 Å. This is particularly advantageous, since small gate 15 to cathode 13 distances result in lower emitter drive voltages.

The next step is the deposition of the flowable insulating layer. The flowable insulating layer comprises at least one of: spin-on-glass (SOG), borophosphosilicate glass (BPSG), or a polyimide, or other suitable material, including, but not limited to, other spin on dielectrics or flowable dielectrics. Under certain conditions, such materials flow easily over the surface of the wafer, resulting in a densified planarized layer. The thickness of the flowable insulating layer, together with the conformal nitride layer determines the gate 15 to substrate 11 spacing.

The preferred embodiment flowable insulator is BPSG. The BPSG layer is also initially deposited by Chemical Vapor Deposition (CVD) using a phosphorous source such as phosphine ($PH_3$) gas. The wafer surface may also be exposed to a boron source such as diborane ($B_2H_6$) gas. The resultant BPSG layer initially covers the cathode tip 13, and is then reflowed. In general, the BPSG reflow is performed at a temperature in the range of 700° C. to 1050° C. In practice, the upper limit of the reflow temperature will be controlled by the effects of the reflow on the substrate and other related structures.

In the preferred embodiment, the BPSG layer is heated to a temperature of approximately 1000° C. to cause a slight flow of the flowable insulating material, preferably, to a substantially uniform level below the emitter tip 13.

After the reflow step, the emitter tip 13 is exposed, thereby providing an opportunity to add another conformal insulating layer prior to the deposition of the conductive gate material layer 15. An insulating material which is selectively etchable with respect to the flowable layer is formed thereon to further adjust the spacing between the gate 15 and the tip 13.

After the composite insulative layer 14 is formed and the conductive gate layer 15 is deposited, a CMP process is undertaken to planarize the layers, as in the illustrated embodiment. A series of selective etch steps are then carried out, as previously described, to expose the tip 13 and adjust the size of the insulator fins.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

What is claimed is:

1. A method for forming self-aligned gate structures around an electron emitter, comprising the steps of:

providing a substrate having at least one electron emitter supported thereon;

overlaying said electron emitter with an oxide layer and a polysilicon layer;

removing portions of both said oxide layer and said polysilicon layer to expose at least a portion of said electron emitter; and removing at least a portion of one of said layers overlaying said emitter through use of chemical mechanical planarization.

2. The method of claim 1, wherein said step of removing said oxide and polysilicon layers is performed in part through chemical mechanical planarization.

3. The method of claim 1, further comprising the step of performing an etch to remove at least a portion of said oxide layer.

4. The method of claim 3, wherein said oxide layer is exposed through use of said chemical mechanical planarization.

5. A method of forming gate structures around an electron emitter, comprising the steps of:

providing a substrate material;

forming an electron emitter supported by said substrate;

depositing a conformal layer of an insulating material over said emitter;

depositing a conductive material over said insulating material; and removing a portion of said insulating and conductive material layers to expose at least a portion of said emitter, said removing performed at least in part through chemical mechanical planarization.

6. The method of claim 5, wherein said conformal layer of an insulating material is deposited directly upon said emitter.

7. The method of claim 5, wherein said conductive material is deposited directly on said layer of an insulating material.

8. A method of forming structures proximate an electron emitter, comprising the steps of:

providing a substrate material;

forming an electron emitter supported on said substrate;

depositing a first layer comprising an insulating material over said emitter;

depositing a second layer comprising a conductive material over said first layer; and removing at least a portion of said second deposited layer through use of chemical mechanical planarization.

9. The method of claim 8, wherein said step of removing further comprises planarizing said second deposited layer and removing a portion of said first deposited layer.

10. A method of forming a gate structure proximate an electron emitter, comprising the steps of:

forming an electron emitter supported by a substrate material;

depositing a conformal layer of an insulating material over said emitter;

depositing a conformal layer of a conductive material over said layer of said insulating material; and planarizing at least one of said insulating and conductive layers through use of a technique including chemical mechanical planarization.

11. The method of claim 10, wherein said conformal layer of an insulating material is deposited directly upon said emitter.

12. The method of claim 10, wherein said conductive material is deposited directly upon said layer of an insulating material.

13. A method of forming structures proximate an electron emitter, comprising the steps of:

providing a substrate material;

forming an electron emitter supported on said substrate;

depositing a first volume of an insulating material over said emitter;

depositing a second volume of a conductive material over said first volume; and removing at least a portion of said second deposited volume through use of a chemical mechanical planarization.

14. The method of claim 13, wherein said step of removing further comprises planarizing said second deposited layer and removing a portion of said first deposited layer.

15. The method of claim 13, wherein said volume of an insulating material is deposited directly overlying said electron emitter.

16. The method of claim 13, wherein said volume of a conductive material is deposited directly upon said volume of an insulating material.

17. A method of forming a gate structure adjacent an electron emitter, said method comprising the steps of:

(a) providing a substrate having an electron emitter extending therefrom, said electron emitter having a base portion and a tip portion, said base portion being coupled to said substrate;

(b) creating a dielectric region surrounding said base portion of said electron emitter, said dielectric region being disposed on said substrate, said dielectric region having a protrusion extending toward said electron emitter; and (c) creating a gate structure adjacent said tip portion of said electron emitter.

18. The method, as set forth in claim 17, wherein step (b) comprises the steps of:

depositing dielectric material on said substrate adjacent said base portion of said electron emitter; and depositing gate material on said dielectric material adjacent said tip portion of said electron emitter.

19. The method, as set forth in claim 18, wherein step (c) comprises the step of:

removing a portion of said gate material adjacent said tip portion of said electron emitter.

20. The method, as set forth in claim 19, wherein said step of removing comprises the step of:

removing said portion of said gate material using a chemical mechanical planarization process.

21. The method, as set forth in claim 19, wherein step (b) further comprises the step of:

selectively removing a portion of said dielectric material to create said protrusion.

22. A method of forming a gate structure adjacent an electron emitter, said method comprising the steps of:

(a) providing a substrate having an electron emitter thereon;

(b) creating a first dielectric region adjacent said electron emitter, said first dielectric region being spaced apart from said electron emitter by a first distance;

(c) creating a second dielectric region adjacent said first dielectric region, said second dielectric region being spaced apart from said electron emitter by a second distance, said second distance being greater than said first distance; and (d) creating a gate structure adjacent and spaced apart from said electron emitter.

23. The method, as set forth in claim 22, wherein step (b) comprises the step of:

depositing a first layer of dielectric material on said electron emitter and said substrate to create said first dielectric region.

24. The method, as set forth in claim 23, wherein step (c) comprises the step of:

depositing a second layer of dielectric material on said first layer of dielectric material to create said second dielectric region.

25. The method, as set forth in claim 24, wherein step (d) comprises the step of:

depositing gate material on said second layer of dielectric material.

26. The method, as set forth in claim 25, wherein step (d) further comprises the step of:

removing a portion of said gate material adjacent said electron emitter.

27. The method, as set forth in claim 26, wherein said step of removing comprises the step of:

removing said portion of said gate material using a chemical mechanical planarization process.

28. The method, as set forth in claim 26, wherein steps (b) and (c) further comprise the step of:

selectively etching said first layer of dielectric material relative to said second layer of dielectric material.

* * * * *